(12) United States Patent
Nagawa et al.

(10) Patent No.: US 11,670,911 B2
(45) Date of Patent: Jun. 6, 2023

(54) LIGHT EMITTING DEVICE AND METHOD OF MANUFACTURING SAME, AND PROJECTOR

(71) Applicant: Seiko Epson Corporation, Tokyo (JP)

(72) Inventors: Michifumi Nagawa, Matsumoto (JP); Shunsuke Ishizawa, Shinjuku (JP)

(73) Assignee: SEIKO EPSON CORPORATION

( * ) Notice: Subject to any disclaimer, the term of this patent is extended or adjusted under 35 U.S.C. 154(b) by 392 days.

(21) Appl. No.: 16/758,920

(22) PCT Filed: Oct. 19, 2018

(86) PCT No.: PCT/JP2018/039049
§ 371 (c)(1),
(2) Date: Apr. 24, 2020

(87) PCT Pub. No.: WO2019/082817
PCT Pub. Date: May 2, 2019

(65) Prior Publication Data
US 2020/0266611 A1    Aug. 20, 2020

(30) Foreign Application Priority Data

Oct. 27, 2017  (JP) .............................. JP2017-208551

(51) Int. Cl.
*H01S 5/00* (2006.01)
*H01S 5/20* (2006.01)
(Continued)

(52) U.S. Cl.
CPC ........ *H01S 5/2018* (2013.01); *H01S 5/04256* (2019.08); *H01S 5/209* (2013.01);
(Continued)

(58) Field of Classification Search
CPC .... H01S 5/2018; H01S 5/04256; H01S 5/209; H01S 5/3211; H01S 5/0281;
(Continued)

(56) References Cited

U.S. PATENT DOCUMENTS

2006/0284187 A1\* 12/2006 Wierer, Jr. .............. C30B 29/60
257/E33.068
2011/0198567 A1\* 8/2011 Shinohara ............... H01L 33/22
257/E33.012
(Continued)

FOREIGN PATENT DOCUMENTS

JP    2004-095837 A    3/2004
JP    2006-179573 A    7/2006
(Continued)

*Primary Examiner* — Kinam Park
(74) *Attorney, Agent, or Firm* — Harness, Dickey & Pierce, P.L.C.

(57) ABSTRACT

A light emitting device is provided that makes it possible to reduce absorption of light by an electrode. The light emitting device includes a substrate, and a laminated structure provided to the substrate, wherein the laminated structure includes a first semiconductor layer, a second semiconductor layer different in conductivity type from the first semiconductor layer, and an active layer disposed between the first semiconductor layer and the second semiconductor layer, the first semiconductor layer is disposed between the substrate and the active layer, a recessed part is disposed at an opposite side to the substrate side of the laminated structure, the recessed part is provided with a low refractive-index part lower in refractive index than the second semiconductor layer, a depth of the recessed part is no larger than a distance between a surface at an opposite side to the substrate side of the laminated structure and the active layer, and an electrode is disposed at an opposite side to the substrate side of the laminated structure.

4 Claims, 11 Drawing Sheets

(51) Int. Cl.
  *H01S 5/042*   (2006.01)
  *H01S 5/32*    (2006.01)
  *G03B 21/20*   (2006.01)
  *H01S 5/343*   (2006.01)
  *H01S 5/028*   (2006.01)

(52) U.S. Cl.
  CPC ........ *H01S 5/3211* (2013.01); *G03B 21/2033* (2013.01); *H01S 5/0281* (2013.01); *H01S 5/04254* (2019.08); *H01S 5/04257* (2019.08); *H01S 5/34333* (2013.01)

(58) Field of Classification Search
  CPC ............. H01S 5/04254; H01S 5/04257; H01S 5/34333; G03B 21/2033
  See application file for complete search history.

(56) References Cited

U.S. PATENT DOCUMENTS

2012/0056222 A1* 3/2012 Kitagawa ................ H01L 33/38
  257/E33.068
2014/0327034 A1* 11/2014 Toyota .................... H01L 33/38
  438/26

FOREIGN PATENT DOCUMENTS

| JP | 2006-352148 A | 12/2006 |
| JP | 2007-049062 A | 2/2007 |
| JP | 2007-324411 A | 12/2007 |
| JP | 2009-231773 A | 10/2009 |
| JP | 2012-059790 A | 3/2012 |
| WO | 2010-047072 A1 | 4/2010 |
| WO | 2013-073485 A1 | 5/2013 |

* cited by examiner

LIGHT EMITTING DEVICE AND METHOD OF MANUFACTURING SAME, AND PROJECTOR The present application is based on, and claims priority from JP Application Serial Number 2017-208551, filed on Oct. 27, 2017, the disclosure of which is hereby incorporated by reference herein in its entirety.

1. TECHNICAL FIELD

The present disclosure relates to a light emitting device and a method of manufacturing the same, and a projector.

2. BACKGROUND ART

In a semiconductor light emitting device such as a semiconductor laser or an LED (Light Emitting Diode), there is used a material such as a GaN series or a GaAs series (see, e.g., JP-A-2007-49062).

It is an important factor significantly affecting a performance of an element such as a threshold current density to confine light in, for example, an active layer of a semiconductor laser. By increasing a difference in refractive index between the active layer and the cladding layer, a light confinement factor can be increased.

However, in such a light emitting device as described above, it is necessary to consider conditions such as lattice matching based on a material of the active layer and a material of a substrate, and the choice of the material is significantly limited. Therefore, it is difficult to gain the difference in refractive index between the active layer and the cladding layer, and it is difficult to increase the light confinement factor. When failing to increase the light confinement factor, the light generated in, for example, the active layer is leaked toward an electrode is absorbed in the electrode to cause a loss.

SUMMARY

One of the objects related to some aspects of the present disclosure is to provide a light emitting device capable of reducing the absorption of the light by the electrode. Alternatively, one of the objects related to some aspects of the present disclosure is to provide a method of manufacturing a light emitting device capable of reducing the absorption of the light by the electrode. Alternatively, one of the objects related to some aspects of the present disclosure is to provide a projector having the light emitting device described above.

Solution to Problem

A light emitting device according to the present disclosure includes a substrate, and a laminated structure provided to the substrate, wherein the laminated structure includes a first semiconductor layer, a second semiconductor layer different in conductivity type from the first semiconductor layer, and an active layer disposed between the first semiconductor layer and the second semiconductor layer, the first semiconductor layer is disposed between the substrate and the active layer, a recessed part is disposed on an opposite side to the substrate side of the laminated structure, the recessed part is provided with a low refractive-index part lower in refractive index than the second semiconductor layer, a depth of the recessed part is no larger than a distance between a surface at an opposite side to the substrate side of the laminated structure and the active layer, and an electrode is disposed at an opposite side to the substrate side of the laminated structure.

In such a light emitting device, it is possible to lower an average refractive index in a planar direction (a direction perpendicular to a stacking direction of the laminated structure) of a part where the recessed part is disposed of the laminated structure. Therefore, in such a light emitting device, it is possible to reduce an amount of leakage of the light generated in the active layer toward the second electrode side. Therefore, in such a light emitting device, it is possible to reduce absorption of the light by the second electrode.

In the light emitting device according to the present disclosure, it is also possible that the laminated structure includes a plurality of columnar parts, and the columnar part includes the first semiconductor layer, the active layer, and the second semiconductor layer.

In such a light emitting device, it is possible to decrease the possibility that the dislocation exists in the active layer, wherein the dislocation is caused by the fact that the lattice constant of the substrate and the lattice constant of the laminated structure are different from each other.

In the light emitting device according to the present disclosure, it is also possible that a plurality of the recessed parts is disposed, the plurality of the recessed parts is arranged in a predetermined direction at a first pitch, the plurality of columnar parts is arranged in the predetermined direction at a second pitch, and the first pitch is smaller than the second pitch.

In such a light emitting device, it is possible to prevent the effect of confining the light generated in the active layer from being affected by the plurality of recessed parts.

In the light emitting device according to the present disclosure, it is also possible that the electrode is disposed at an opposite side to the substrate side of the low refractive-index part.

In such a light emitting device, it is possible to reduce the resistance in the planar direction of the second electrode.

In the light emitting device according to the present disclosure, it is also possible that the low refractive-index part is a void.

In such a light emitting device, it is possible to lower the average refractive index in the planer direction of the part where the recessed parts are disposed of the laminated structure compared to when the low refractive-index part is not the void.

A method of manufacturing a light emitting device according to the present disclosure includes a step of forming a first semiconductor layer, an active layer, and a second semiconductor layer different in conductivity type from the first semiconductor layer in this order on a substrate to form a laminated structure, a step of forming an electrode at an opposite side to the substrate side of the laminated structure, a step of performing patterning on the electrode, and a step of performing patterning on the laminated structure using the electrode on which the patterning was performed as a mask to form a recessed part provided with a low refractive-index part lower in refractive index than the second semiconductor layer in the laminated structure, wherein in the step of forming the recessed part, the recessed part is formed so that a depth of the recessed part is no larger than a distance between a surface on an opposite side to the substrate side of the laminated structure and the active layer.

In such a method of manufacturing the light emitting device, it is possible manufacture the light emitting device making it possible to reduce absorption of the light by the second electrode.

A method of manufacturing a light emitting device according to the present disclosure includes a step of forming a first semiconductor layer, an active layer, and a second semiconductor layer different in conductivity type from the first semiconductor layer in this order on a substrate to form a laminated structure, a step of forming a recessed part at an opposite side to the substrate of the laminated structure, the recessed part being provided with a low refractive-index part lower in refractive index than the second semiconductor layer, and a step of forming an electrode at an opposite side to the substrate of the laminated structure after the step of forming the recessed part, wherein in the step of forming the recessed part, the recessed part is formed so that a depth of the recessed part is no larger than a distance between a surface at an opposite side to the substrate side of the laminated structure and the active layer.

In such a method of manufacturing the light emitting device, it is possible manufacture the light emitting device making it possible to reduce absorption of the light by the second electrode.

In the method of manufacturing the light emitting device according to the present disclosure, it is possible that in the step of forming the recessed part, the recessed part is formed by etching, and in the step of forming the laminated structure, an etch stopper layer is formed between the active layer and the second semiconductor layer.

In such a method of manufacturing the light emitting device, it is possible to prevent the active layer from being etched in the etching process for forming the recessed parts.

A projector according to the present disclosure includes the light emitting device according to the present disclosure.

In such a projector, it is possible to include the light emitting device according to the present disclosure.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment 1.1. Light Emitting Device

Figure 1:
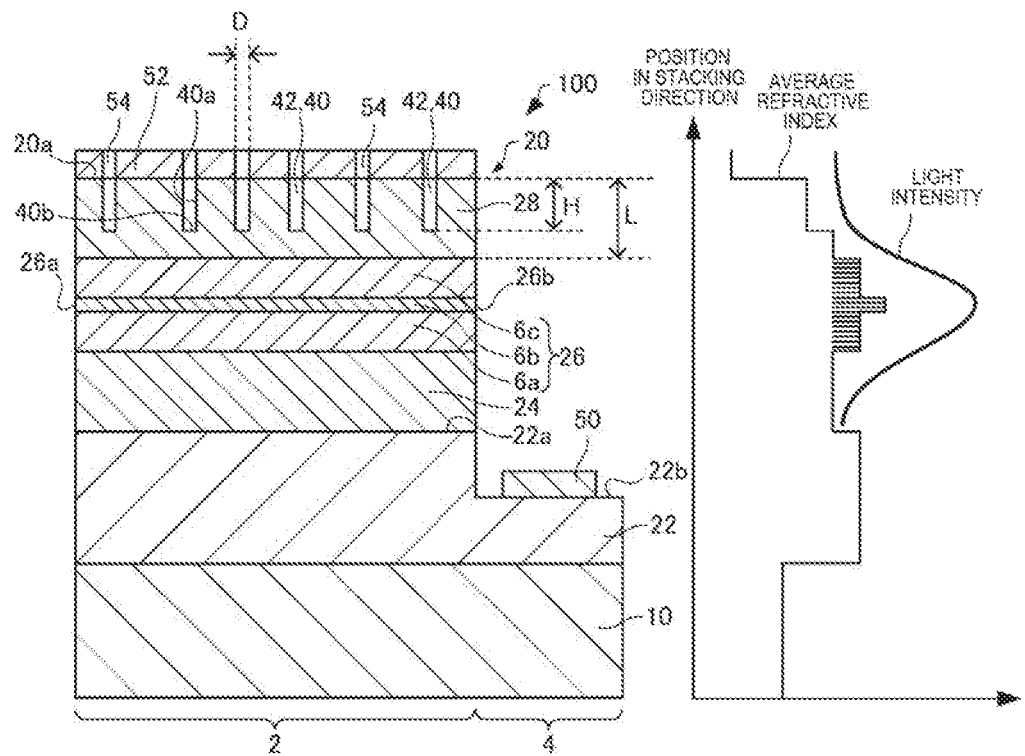
FIG. 1 is a cross-sectional view schematically showing a light emitting device according to a first embodiment.
Figure 2:
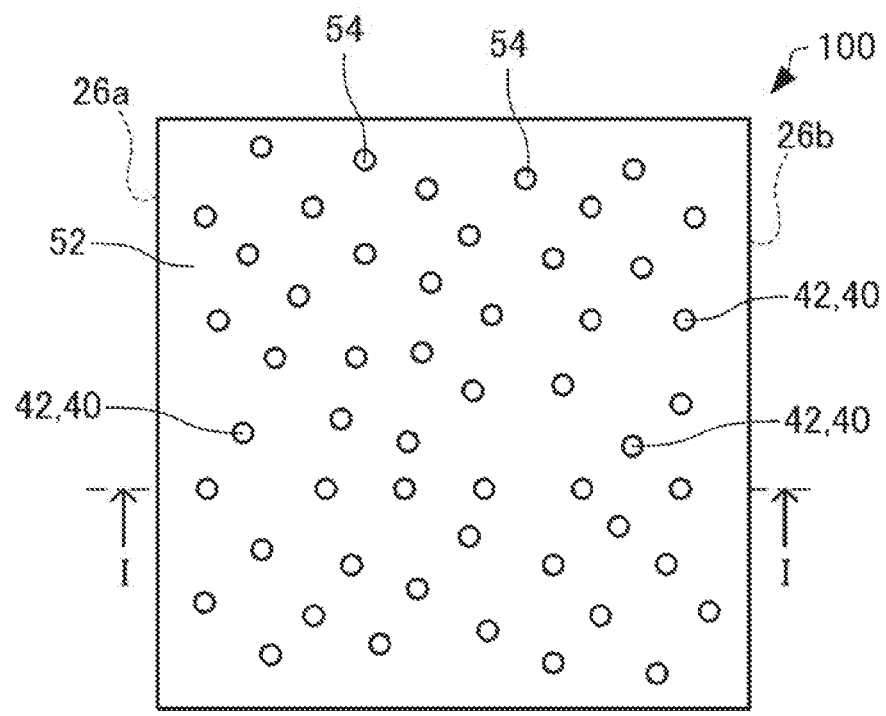
FIG. 2 is a plan view schematically showing the light emitting device according to the first embodiment.

Firstly, a light emitting device according to a first embodiment will be described with reference to the drawings. FIG. 1 is a cross-sectional view schematically showing the light emitting device 100 according to the first embodiment. FIG. 2 is a plan view schematically showing the light emitting device 100 according to the first embodiment. It should be noted that FIG. 1 is a cross-sectional view along the line I-I shown in FIG. 2.

As shown in FIG. 1 and FIG. 2, the light emitting device 100 has a substrate 10, a laminated structure 20, a first electrode 50, and a second electrode 52.

The substrate 10 has, for example, a plate-like shape. The substrate 10 is, for example, an Si substrate, a GaN substrate, or a sapphire substrate.

The laminated structure 20 is provided to the substrate 10 (disposed on the substrate 10). The laminated structure 20 has a buffer layer 22, a first semiconductor layer 24, an active layer 26, and a second semiconductor layer 28.

It should be noted that in the present disclosure, "up" denotes a direction of getting away from the substrate 10 viewed from the active layer 26 in a stacking direction of the laminated structure 20 (hereinafter also referred to simply as a "stacking direction"), and "down" denotes a direction of getting closer to the substrate 10 viewed from the active layer 26 in the stacking direction.

Further, in the present disclosure, the "stacking direction of the laminated structure 20" denotes a stacking direction (up/down direction in the illustrated example) of the first semiconductor layer 24 and the active layer 26.

The buffer layer 22 is disposed on the substrate 10. The buffer layer 22 is, for example, a GaN layer (specifically, an Si-doped GaN layer) of a first conductivity type (e.g., an n-type).

The buffer layer 22 has a first upper surface 22a and a second upper surface 22b. The first upper surface 22a is a surface provided with, for example, the first semiconductor layer 24. The second upper surface 22b is a surface provided with, for example, the first electrode 50. In the illustrated example, the second upper surface 22b is located below the first upper surface 22a. The light emitting device 100 has, for example, a first area 2 overlapping the first upper surface 22a and a second area 4 overlapping the second upper surface 22b in a plan view.

It should be noted that in FIG. 1, an average refractive index and the light intensity in a planar direction in the first area 2 of the light emitting device 100 are schematically shown. Here, the "average refractive index in the planar direction" means an average refractive index in a direction perpendicular to the stacking direction at a predetermined position in the stacking direction. For example, as the buffer layer 22, in the layer made of a material uniform in the planar direction, the average refractive index in the planar direction is simply the refractive index (the refractive index of the buffer layer 22) of a material constituting the layer.

Further, in FIG. 2, illustration of the second area 4 of the light emitting device 100 is omitted for the sake of convenience.

The first semiconductor layer 24 is disposed on the buffer layer 22. The first semiconductor layer 24 is disposed between the substrate 10 and the active layer 26. The first semiconductor layer 24 is, for example, a GaN layer (specifically, an Si-doped GaN layer) of the first conductivity type (e.g., the n-type), or an AlGaN layer.

The active layer 26 is disposed on the first semiconductor layer 24. The active layer 26 is disposed between the first semiconductor layer 24 and the second semiconductor layers 28. The active layer 26 has a first side surface 26a and a second side surface 26b. The side surfaces 26a, 26b are surfaces (surfaces parallel to each other in the illustrated example) opposed to each other. The active layer 26 has a first guide layer 6a, a quantum-well layer 6b, and a second guide layer 6c.

The first guide layer 6a is disposed on the first semiconductor layer 24. The first guide layer 6a has a semiconductor superlattice (SL) structure constituted by, for example, GaN layers and InGaN layers. The numbers of the GaN layers and the InGaN layers constituting the first guide layer 6a are not particularly limited. An average of the refractive index of the GaN layers constituting the first guide layer 6a and the refractive index of the InGaN layers is higher than the refractive index of the first semiconductor layer 24.

The quantum-well layer 6b is disposed on the first guide layer 6a. The quantum-well layer 6b is a layer capable of emitting light in response to injection of an electrical current. The quantum-well layer 6b has a quantum-well (MQW) structure constituted by, for example, GaN layers and InGaN layers. The numbers of the GaN layers and the InGaN layers constituting the quantum-well layer 6b are not particularly limited. An average of the refractive index of the GaN layers constituting the quantum-well layer 6b and the refractive index of the InGaN layers is higher than an average of the refractive index of the GaN layers constituting the first guide layer 6a and the refractive index of the InGaN layers, and an average of the refractive index of the GaN layers constituting the second guide layer 6c and the refractive index of the InGaN layers.

The second guide layer 6c is disposed on the quantum-well layer 6b. The second guide layer 6c has the semiconductor superlattice (SL) structure constituted by, for example, GaN layers and InGaN layers. The numbers of the GaN layers and the InGaN layers constituting the second guide layer 6c are not particularly limited. An average of the refractive index of the GaN layers constituting the second guide layer 6c and the refractive index of the InGaN layers is higher than the refractive index of the second semiconductor layer 28. The guide layers 6a, 6c have a function of increasing an overlap between the quantum-well layer 6b and the light propagating in the planar direction (increasing the light confinement factor).

The second semiconductor layer 28 is disposed on the active layer 26. The second semiconductor layer 28 is a layer different in conductivity type from the first semiconductor layer 24. The second semiconductor layer 28 is, for example, a GaN layer (specifically, an Mg-doped GaN layer) of a second conductivity type (e.g., a p-type), or an AlGaN layer. The semiconductor layers 24, 28 are each a cladding layer having a function of confining the light in the active layer 26 (inhibiting the light from being leaked from the active layer 26).

At the opposite side to the substrate 10 side of the laminated structure 20, there are disposed recessed parts 40. The recessed part 40 has an opening on an upper surface 20a of the laminated structure 20. The upper surface 20a is a surface at an opposite side to the substrate 10 side of the laminated structure 20. In the illustrated example, the upper surface 20a is a surface of the second semiconductor layer 28, and has contact with the second electrode 52. The laminated structure 20 has a concavo-convex shape constituted by the upper surface 20a and an inner side surface 40a and a bottom surface 40b of the recessed part 40. In the illustrated example, the inner side surface 40a and the bottom surface 40b are surfaces of the second semiconductor layer 28 defining the recessed part 40.

The depth (the size in the stacking direction) H of the recessed part 40 is no larger than a distance L between the upper surface 20a of the laminated structure 20 and the active layer 26. In the illustrated example, the depth H of the recessed part 40 is smaller than the distance L.

The planar shape (the shape viewed from the stacking direction) of the recessed part 40 is, for example, a circle. The number of the recessed parts 40 provided is, for example, more than one. The plurality of recessed parts 40 can also be arranged at a predetermined pitch in a predetermined direction, or can also be disposed randomly as shown in the drawing. It is also possible for the second semiconductor layer 28 to have a part to be porous with the plurality of recessed parts 40.

It should be noted that although not shown in the drawings, the recessed parts 40 can be disposed in stripes, or can also be disposed in a mesh. It should be noted that taking the resistance in the planar direction of the second electrode 52 into consideration, it is preferable to dispose the plurality of recessed parts 40 small in opening size.

The opening size (e.g., a diameter of a minimum circle (a minimum enclosing circle) including a polygon inside, when the planar shape of the recessed part 40 is the polygon, or a diameter in the case of a circle shown in the drawing) D of the recessed part 40 is, for example, no smaller than 5 nm and no larger than 500 nm. An interval between the recessed parts 40 adjacent to each other is, for example, no smaller than 5 nm and no larger than 500 nm. The ratio (H/D) between the depth H of the recessed part 40 and the opening size D of the recessed part 40 can be 5 times or more.

The recessed part 40 is provided with a low refractive-index part 42 lower in refractive index than the second semiconductor layer 28. In the illustrated example, the low refractive-index part 42 is a void (air). The second electrode 52 is not disposed on the low refractive-index part 42.

An average refractive index in the planar direction of a part (a part where the recessed parts 40 are disposed of the second semiconductor layer 28) where the low refractive-index parts 42 are disposed is lower than the average refractive index in the planar direction of a part where the recessed parts 40 are not disposed of the second semiconductor layer 28. Here, the average refractive index $n_{AVE}$ in the planar direction of the part where the low refractive-index parts 42 are disposed in the stacking direction is expressed as the formula (1) described below.

Math. 1

$$n_{AVE} = \sqrt{\varepsilon_1 \cdot \varphi + \varepsilon_2 (1-\varphi)} \qquad (1)$$

It should be noted that in the formula (1), $\varepsilon_1$ denotes the dielectric constant of the second semiconductor layer 28. The dielectric constant of the low refractive-index part 42 is denoted by $\varepsilon_2$. The filling rate (the ratio (S1/(S1+S2)) between the cross-sectional area S1 of the second semiconductor layer 28 and the cross-sectional area S2 of the low refractive-index part 42 when being cut by a plane parallel to the planar direction) of the second semiconductor layer 28 in the planar direction of the part where the low refractive-index parts 42 is denoted by $\varphi$. When the low refractive-index part 42 is the void, $\varepsilon_2$ becomes the dielectric constant of air.

In the light emitting device 100, the p-type second semiconductor layer 28, the active layer 26 with no impurity doped, and the n-type first semiconductor layer 24 constitute a pin diode. Each of the first semiconductor layer 24 and the second semiconductor layer 28 is a layer larger in bandgap than the active layer 26. In the light emitting device 100, when applying a forward bias voltage of the pin diode (when injecting an electrical current) between the first electrode 50 and the second electrode 52, there occurs recombination of electrons and holes in the active layer 26. The recombination causes light emission. The light generated in the active layer 26 propagates in the planar direction due to the semiconductor layers 24, 28, and is multiply reflected between the first side surface 26a and the second side surface 26b of the active layer 26 to generate a standing wave, and obtains the gain in the active layer 26 to cause laser oscillation. Then, the light emitting device 100 emits the laser beam from the first side surface 26a or the second side surface 26b.

The first electrode 50 is disposed on the buffer layer 22. In the illustrated example, the first electrode 50 is disposed on the second upper surface 22b of the buffer layer 22. It is also possible for the buffer layer 22 to have ohmic contact with the first electrode 50. The first electrode 50 is electrically coupled to the first semiconductor layer 24. In the illustrated example, the first electrode 50 is electrically coupled to the first semiconductor layer 24 via the buffer layer 22. The first electrode 50 is one electrode for injecting the current into the active layer 26. As the first electrode 50, there is used, for example, what is obtained by stacking a Ti layer, an Al layer, and an Au layer in this order from the buffer layer 22 side.

It should be noted that although not shown in the drawings, it is also possible for the laminated structure 20 to have a first contact layer between the first electrode 50 and the buffer layer 22. The first contact layer can have ohmic contact with the first electrodes 50. The first contact layer can also be an n-type GaN layer. Further, when the substrate 10 has electrical conductivity, it is also possible for the first electrode 50 to be disposed below the substrate 10 although not shown in the drawings.

The second electrode 52 is disposed at the opposite side to the substrate 10 side of the second semiconductor layer 28. The second electrode 52 is disposed on the second semiconductor layer 28. In the illustrated example, the second electrode 52 is not disposed on the inner side surface 40a and the bottom surface 40b of the recessed part 40. Further, the second electrode 52 is provided with a plurality of through holes 54. The through hole 54 is located above the recessed part 40, and is communicated with the recessed part 40. The second electrode 52 is the other electrode for injecting the current into the active layer 26. As the second electrode 52, there can be used, for example, what is obtained by stacking an Au layer and a Pt layer in this order from above or below, or what is obtained by stacking an Au layer and an Ni layer in this order.

It should be noted that although not shown in the drawings, it is also possible for the laminated structure 20 to have a second contact layer between the second electrode 52 and the second semiconductor layer 28. The second contact layer can have ohmic contact with the second electrodes 52. The second contact layer can also be a p-type GaN layer.

Further, although the active layer 26 of the InGaN system is described above, any material system capable of emitting light in response to injection of an electrical current can be used as the active layer 26. It is possible to use semiconductor materials such as an AlGaN system, an AlGaAs system, an InGaAs system, an InGaAsP system, an InP system, a GaP system, or an AlGaP system.

The light emitting device 100 has, for example, the following features.

In the light emitting device 100, the recessed parts 40 are disposed at the opposite side to the substrate 10 side of the laminated structure 20, the recessed part 40 is provided with the low refractive-index part 42 lower in refractive index than the second semiconductor layer 28, the depth H of the recessed part 40 is no larger than the distance L between the upper surface 20a of the laminated structure 20 and the active layer 26, and the second electrode 52 is disposed at the opposite side to the substrate 10 side of the laminated structure 20. Therefore, in the light emitting device 100, it is possible to lower the average refractive index in the planer direction of the part where the recessed parts 40 are disposed of the laminated structure 20. Therefore, in the light emitting device 100, it is possible to reduce the amount of the light which is generated in the active layer 26 and is then leaked toward the second electrode 52 side when propagating in the planer direction. Therefore, in the light emitting device 100, it is possible to reduce the absorption of the light by the second electrode 52, and thus, it is possible to suppress the loss of the light due to the second electrode 52. As a result, in the light emitting device 100, it is possible to reduce the absorption of the light by the second electrode 52 without, for example, increasing the thickness of the second semiconductor layer 28, and therefore, it is possible to achieve reduction in resistance of the second semiconductor layer 28, and thus, an increase in performance can be achieved. As shown in FIG. 1, in the light emitting device 100, for example, it is possible to locate a peak of the light intensity in the active layer 26.

Figure 3:
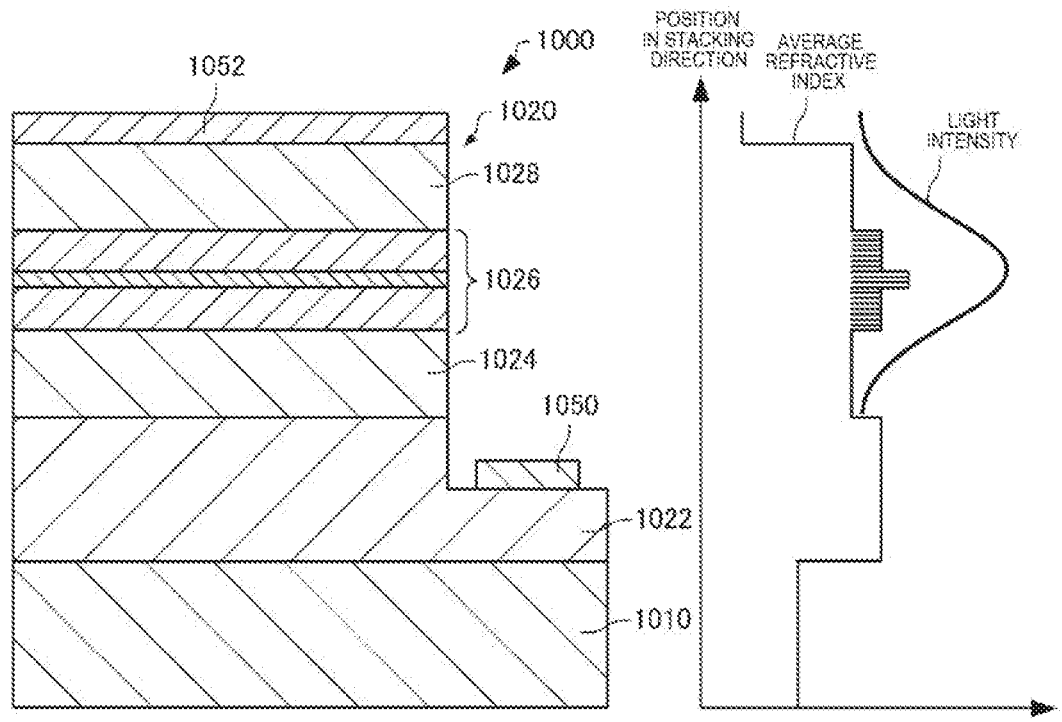
FIG. 3 is a cross-sectional view schematically showing a light emitting device according to a reference example.

As shown in FIG. 3, in a light emitting device 1000 (the light emitting device 1000 according to a reference example) in which a laminated structure 1020 is not provided with recessed parts, since the laminated structure 1020 does not have a part where the average refractive index in the planar direction lowers, the light generated in an active layer 1026 is leaked toward a second electrode 1052 side in some cases. Further, the light generated in the active layer 1026 is absorbed in the second electrode 1052 to cause a loss in some cases. It should be noted that the light emitting device 1000 includes a substrate 1010, the laminated structure 1020, a first electrode 1050, and the second electrode 1052. The laminated structure 1020 has a buffer layer 1022, a first semiconductor layer 1024, the active layer 1026, and a second semiconductor layer 1028.

Further, in the light emitting device 100, since the recessed parts 40 are disposed at the opposite side to the substrate 10 side of the laminated structure 20, it is easy to form the recessed parts 40 compared to, for example, when disposing the recessed parts at the substrate side of the laminated structure.

In the light emitting device 100, the low refractive-index part 42 is the void. Therefore, in the light emitting device 100, it is possible to lower the average refractive index in the planer direction of the part where the recessed parts 40 are disposed of the laminated structure 20 compared to when the low refractive-index part 42 is not the void.

1.2. Method of Manufacturing Light Emitting Device

Figure 4:
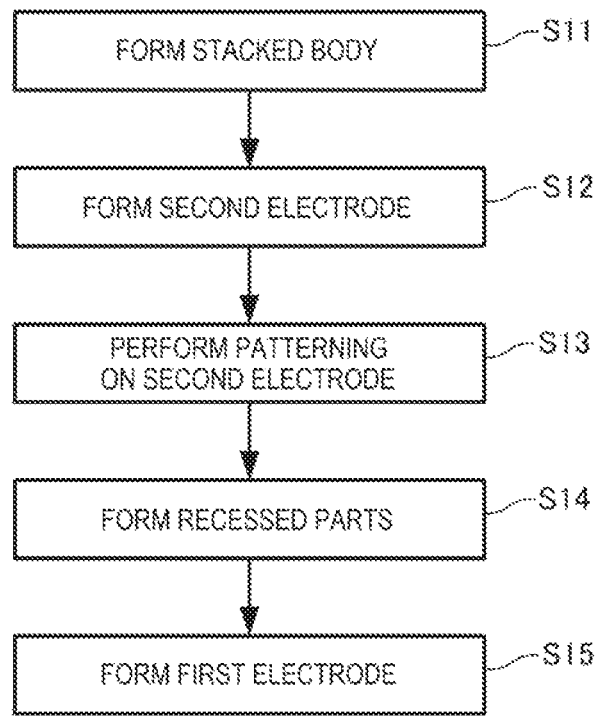
FIG. 4 is a flowchart for explaining a method of manufacturing the light emitting device according to the first embodiment.
Figure 5:
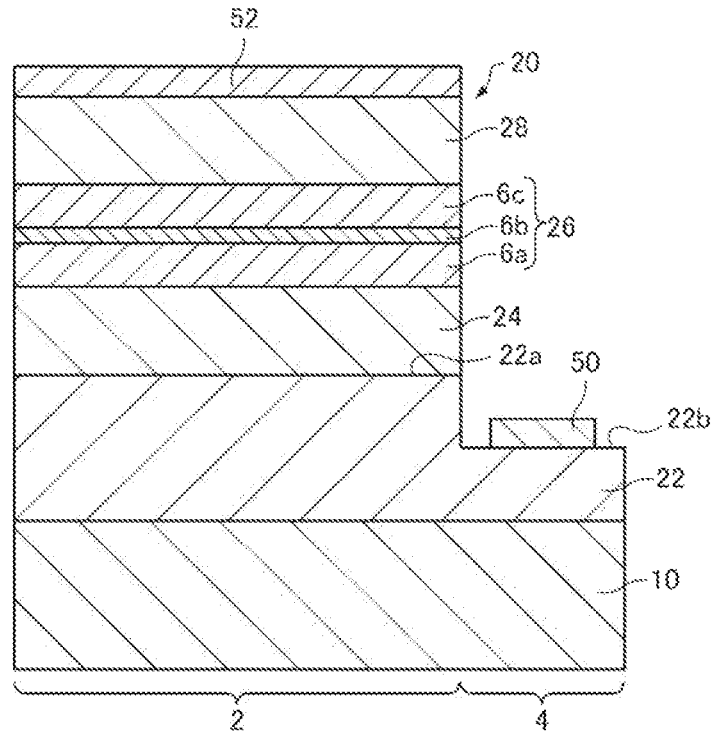
FIG. 5 is a cross-sectional view schematically showing a manufacturing process of the light emitting device according to the first embodiment.
Figure 6:
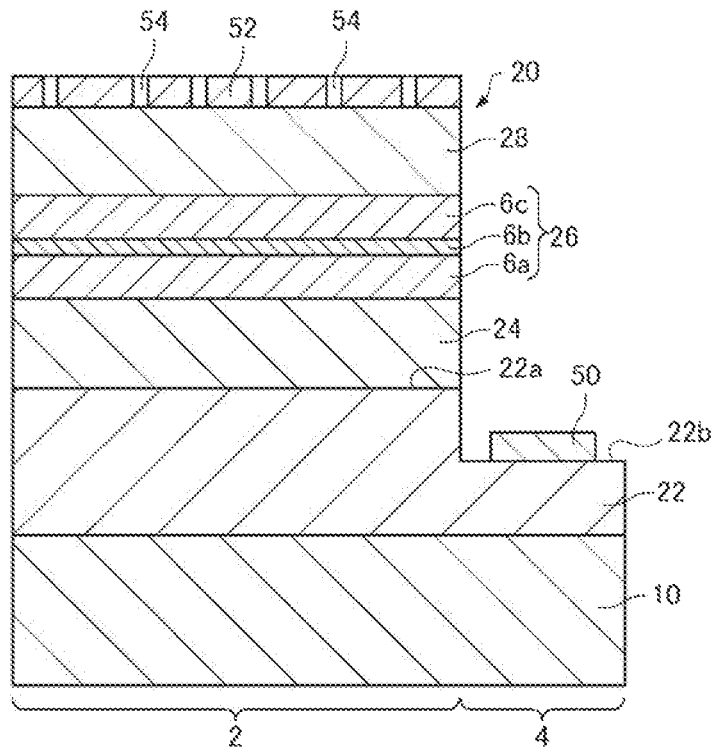
FIG. 6 is a cross-sectional view schematically showing the manufacturing process of the light emitting device according to the first embodiment.

Then, a method of manufacturing the light emitting device 100 according to the first embodiment will be described with reference to the drawings. FIG. 4 is a flowchart for explaining the method of manufacturing the light emitting device 100 according to the first embodiment. FIG. 5 and FIG. 6 are cross-sectional views schematically showing a manufacturing process of the light emitting device 100 according to the first embodiment.

As shown in FIG. 5, the buffer layer 22, the first semiconductor layer 24, the active layer 26, and the second semiconductor layer 28 are formed on the substrate 10 in this order to form (step S11) the laminated structure 20. Specifically, the buffer layer 22, the first semiconductor layer 24, the active layer 26, and the second semiconductor layer 28 are epitaxially grown on the substrate 10 in this order. As the method of epitaxially growing the layers, there can be cited, for example, an MOCVD (Metal Organic Chemical Vapor Deposition) method and an MBE (Molecular Beam Epitaxy) method.

It should be noted that it is possible to prevent the semiconductor layers 24, 28 and the active layer 26 from being formed on the second area 4 of the buffer layer 22 by disposing a mask layer (not shown) in the second area 4 of the buffer layer 22. Alternatively, it is also possible to expose the second upper surface 22b of the buffer layer 22 by removing the semiconductor layers 24, 28 and the active layer 26 in the second area 4 after forming the semiconductor layers 24, 28 and the active layer 26 on the second area 4 of the buffer layer 22.

Then, the second electrode 52 is formed (step S12) on the second semiconductor layer 28. The second electrode 52 is formed using, for example, a vacuum deposition method or a sputtering method.

As shown in FIG. 6, patterning is performed (step S13) on the second electrode 52. Thus, it is possible to form the plurality of through holes 54 in the second electrode 52. The patterning is performed using, for example, electron-beam lithography or colloidal lithography. The colloidal lithography is a simplified process suitable for high-volume production.

As shown in FIG. 1, patterning (etching) is performed on the laminated structure 20 using the second electrode 52 on which the patterning has been performed as a mask to form (step S14) the recessed parts 40 provided with the low refractive-index parts 42 in the laminated structure 20. In the present process, the recessed parts 40 are formed so that the depth H of the recessed parts 40 becomes no larger than the distance L.

Then, the first electrode 50 is formed (step S15) on the second upper surface 22b of the buffer layer 22. The first electrode 50 is formed using, for example, a vacuum deposition method or a sputtering method. It should be noted that the process (step S15) of forming the first electrode 50 can also be executed before the process (step S12) of forming the second electrode 52. Subsequently, for example, the substrate 10 is cut out so as to have a predetermined shape.

According to the process described hereinabove, it is possible to manufacture the light emitting device 100.

In the method of manufacturing the light emitting device 100, the patterning is performed on the laminated structure 20 using the second electrode 52 on which the patterning has been performed as the mask to form the recessed parts 40 in the laminated structure 20. Therefore, in the method of manufacturing the light emitting device 100, there is no need to additionally form the mask in order to form the recessed parts 40, and it is possible to easily form the recessed parts 40. Further, in the method of manufacturing the light emitting device 100, it is possible to prevent the second electrode 52 from entering the recessed parts 40. When the second electrode 52 enters the recessed parts 40, the light generated in the active layer 26 is absorbed in some cases by the second electrode 52 having entered the recessed parts 40.

1.3. Modified Examples of Light Emitting Device 1.3.1. First Modified Example

Figure 7:
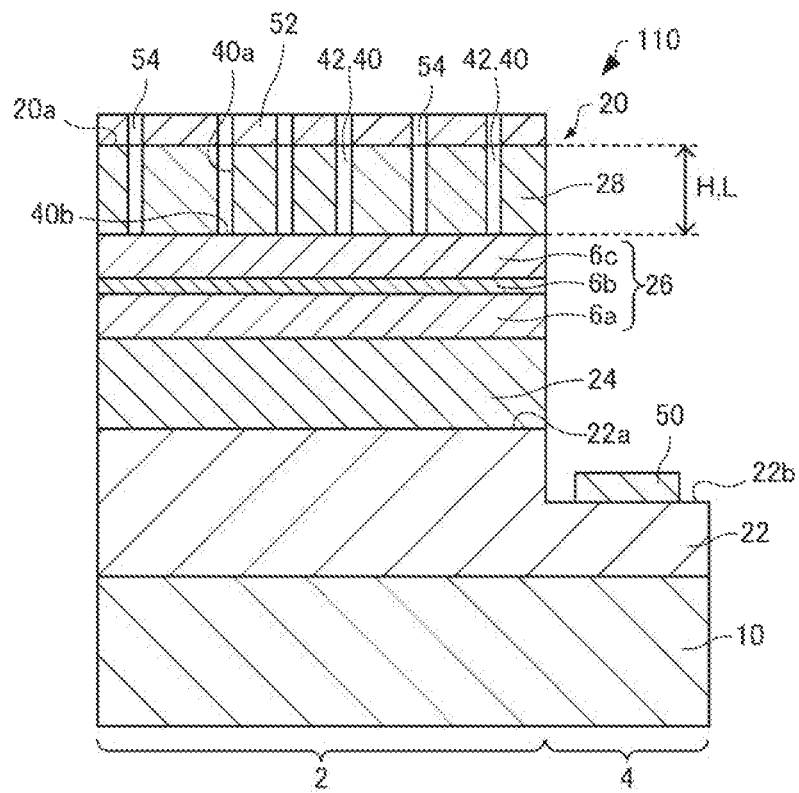
FIG. 7 is a cross-sectional view schematically showing a light emitting device according to a first modified example of the first embodiment.

Then, a light emitting device according to a first modified example of the first embodiment will be described with reference to the drawings. FIG. 7 is a cross-sectional view schematically showing the light emitting device 110 according to the first modified example of the first embodiment.

Hereinafter, in the light emitting device 110 according to the first modified example of the first embodiment, the members having substantially the same functions as those of the constituent members of the light emitting device 100 according to the first embodiment described above will be denoted by the same reference symbols, and detailed descriptions thereof will be omitted. The same applies to light emitting devices according to second, third, and fourth modified examples of the first embodiment described later.

As shown in FIG. 1, in the light emitting device 100 described above, the bottom surface 40b of the recessed part 40 is the surface of the second semiconductor layer 28. In contrast, as shown in FIG. 7, in the light emitting device 110, the bottom surface 40b of the recessed part 40 is a surface of the active layer 26. The depth H of the recessed part 40 is the same as the distance L between the upper surface 20a of the laminated structure 20 and the active layer 26.

It is possible for the light emitting device 110 to exert substantially the same advantages as those of the light emitting device 100 described above.

In the light emitting device 110, the depth H of the recessed part 40 is the same as the distance L. Therefore, in the light emitting device 110, it is possible to lower the average refractive index in the planar direction at the position closer to the active layer 26 compared to when the bottom surface 40b of the recessed part 40 is the surface of the second semiconductor layer 28. Therefore, in the light emitting device 110, it is possible to further reduce the amount of the light leaked from the active layer 26.

1.3.2. Second Modified Example

Figure 8:
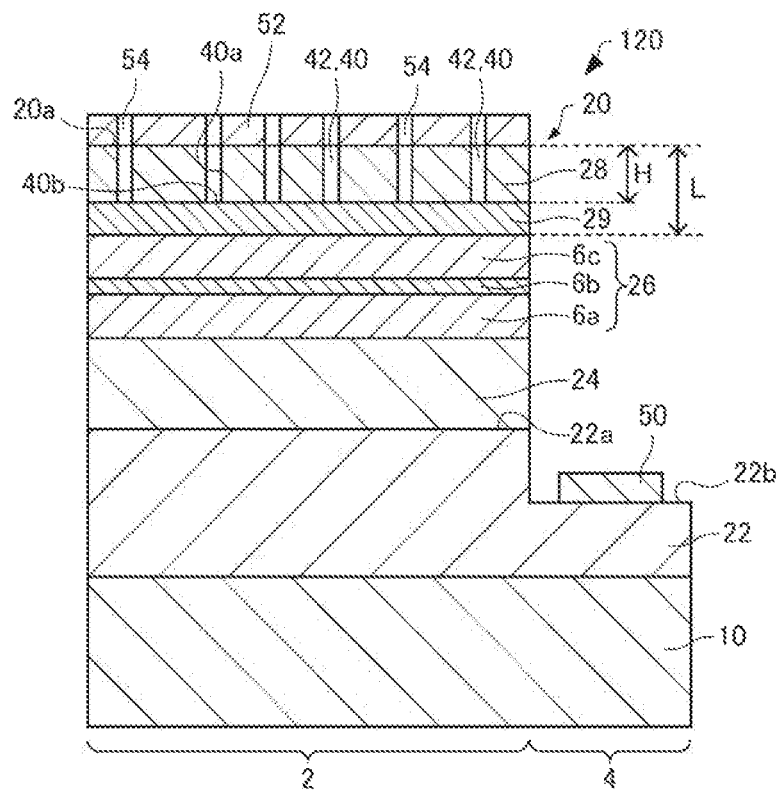
FIG. 8 is a cross-sectional view schematically showing a light emitting device according to a second modified example of the first embodiment.

Then, the light emitting device according to the second modified example of the first embodiment will be described with reference to the drawings. FIG. 8 is a cross-sectional view schematically showing the light emitting device 120 according to the second modified example of the first embodiment.

As shown in FIG. 1, in the light emitting device 100 described above, the bottom surface 40b of the recessed part 40 is the surface of the second semiconductor layer 28. In contrast, as shown in FIG. 8, in the light emitting device 120, the bottom surface 40b of the recessed part 40 is a surface of an etch stopper layer 29.

In the light emitting device 120, the laminated structure 20 has the etch stopper layer 29. The etch stopper layer 29 is disposed between the active layer 26 and the second semiconductor layers 28. The etch stopper layer 29 is, for example, an AlGaN layer (specifically, an Mg-doped AlGaN layer) of the second conductivity type (e.g., the p-type). When both of the second semiconductor layer 28 and the etch stopper layer 29 are the AlGaN layers, the etch stopper layer 29 includes more Al than in the second semiconductor layer 28. By the etch stopper layer 29 including Al, it is possible for the etch stopper layer 29 to function as an etch stopper in the process (the step S14) of forming the recessed parts 40.

The recessed parts 40 are formed by etching. When forming the recessed parts 40 using dry etching, the etching rate of the etch stopper layer 29 with respect to the etching gas used in etching for forming the recessed parts 40 is lower than the etching rate of the second semiconductor layer 28. Alternatively, when forming the recessed parts 40 using wet etching, the etching rate of the etch stopper layer 29 with respect to the etching solution used in etching for forming the recessed parts 40 is lower than the etching rate of the second semiconductor layer 28.

The etch stopper layer 29 is formed using, for example, the MOCVD method or the MBE method.

It is possible for the light emitting device 120 to exert substantially the same advantages as those of the light emitting device 100 described above.

In the light emitting device 120, the laminated structure 20 has the etch stopper layer 29 between the active layer 26 and the second semiconductor layers 28. Therefore, in the method of manufacturing the light emitting device 120, it is possible to prevent the active layer 26 from being etched in the etching process for forming the recessed parts 40, and it is possible to make the film thickness of the active layer 26 have a predetermined value.

1.3.3. Third Modified Example

Figure 9:
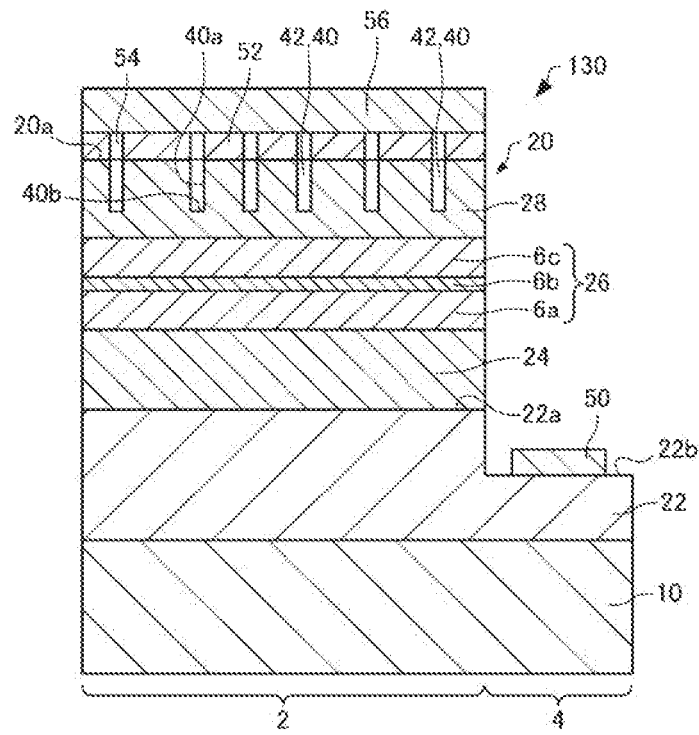
FIG. 9 is a cross-sectional view schematically showing a light emitting device according to a third modified example of the first embodiment.

Then, the light emitting device according to the third modified example of the first embodiment will be described with reference to the drawings. FIG. 9 is a cross-sectional view schematically showing the light emitting device 130 according to the third modified example of the first embodiment.

The light emitting device 130 is different from the light emitting device 100 described above in the point that a conductive layer 56 is disposed on the second electrode 52 as shown in FIG. 9.

The conductive layer 56 covers the through holes 54 provided to the second electrode 52. The thickness of the conductive layer 56 is larger than the thickness of the second electrode 52, for example. The conductive layer 56 is, for example, an Au layer, a Pt layer, or an Ni layer.

The conductive layer 56 is formed using, for example, oblique vapor deposition after forming (step S14) the recessed parts 40 in the laminated structure 20. Thus, it is possible to prevent the conductive layer 56 (the metal for forming the conductive layer 56) from entering the recessed parts 40. When the conductive layer 56 enters the recessed parts 40, the light generated in the active layer 26 is absorbed in some cases by the conductive layer 56 having entered the recessed parts 40.

It is possible for the light emitting device 130 to exert substantially the same advantages as those of the light emitting device 100 described above.

In the light emitting device 130, the conductive layer 56 is disposed on the second electrode 52 so as to cover the through holes 54. Therefore, it is possible to reduce the resistance in the planer direction with respect to the electrical current flowing through the second electrode 52 and the conductive layer 56.

1.3.4. Fourth Modified Example

Figure 10:
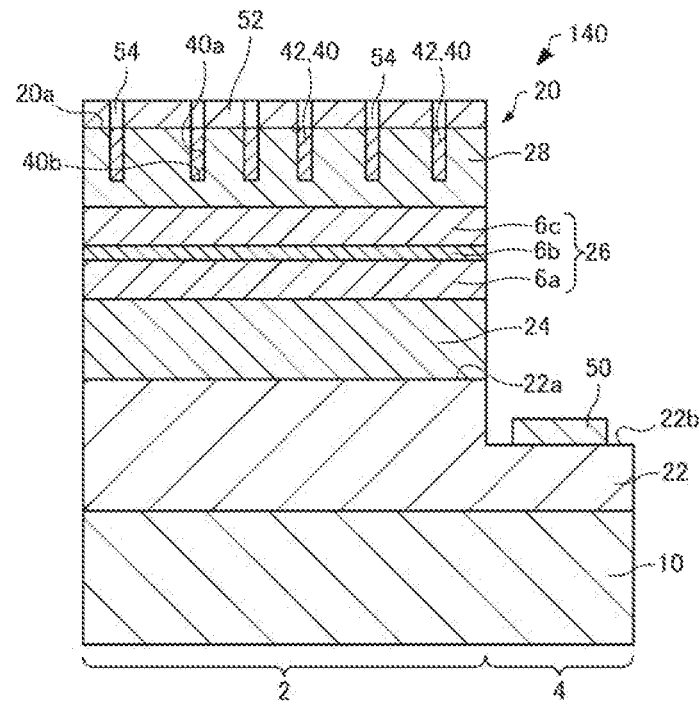
FIG. 10 is a cross-sectional view schematically showing a light emitting device according to a fourth modified example of the first embodiment.

Then, the light emitting device according to the fourth modified example of the first embodiment will be described with reference to the drawings. FIG. 10 is a cross-sectional view schematically showing the light emitting device 140 according to the fourth modified example of the first embodiment.

As shown in FIG. 1, in the light emitting device 100 described above, the low refractive-index part 42 is the void. In contrast, in the light emitting device 140, the low refractive-index part 42 is not the void as shown in FIG. 10.

In the light emitting device 140, the material of the low refractive-index part 42 is AlGaN, AlN, InAlN, silicon oxide, silicon nitride, polyimide, or the like. The low refractive-index part 42 is formed using, for example, the MOCVD method, the MBE method, or the CVD (Chemical Vapor Deposition) method.

It is possible for the light emitting device 140 to exert substantially the same advantages as those of the light emitting device 100 described above.

2. Second Embodiment

2.1. Light Emitting Device

Figure 11:
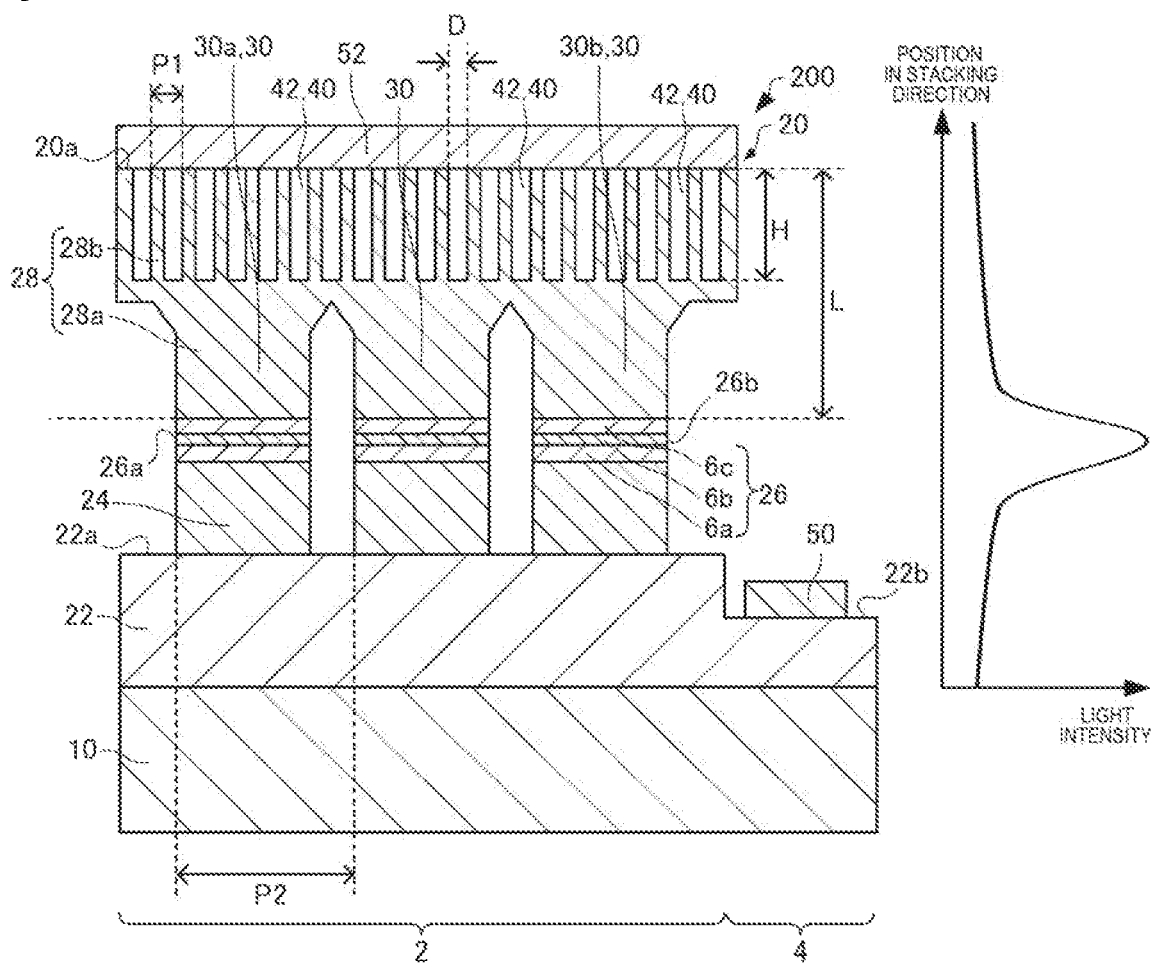
FIG. 11 is a cross-sectional view schematically showing a light emitting device according to a second embodiment.

Then, a light emitting device according to a second embodiment will be described with reference to the drawings. FIG. 11 is a cross-sectional view schematically showing the light emitting device 200 according to the second embodiment.

Hereinafter, in the light emitting device 200 according to the second embodiment, the members having substantially the same functions as those of the constituent members of the light emitting device 100 according to the first embodiment described above will be denoted by the same reference symbols, and detailed descriptions thereof will be omitted.

In the light emitting device 100 described above, as shown in FIG. 1, the through holes 54 are disposed in the second electrode 52. In contrast, in the light emitting device 200, as shown in FIG. 11, the through holes 54 are not disposed in the second electrode 52. It should be noted that in FIG. 11, the light intensity in the planar direction in the first area 2 of the light emitting device 200 is schematically shown.

In the light emitting device 200, the second electrode 52 is disposed on the second semiconductor layer 28 and on the low refractive-index parts 42 (at the opposite side to the substrate 10 side of the low refractive-index parts 42). The second electrode 52 is disposed so as to seal the recessed parts 40, for example.

In the light emitting device 200, the laminated structure has a plurality of columnar parts 30. The second semiconductor layer 28 has a columnar part forming part 28a constituting the columnar parts 30, and a recessed part forming part 28b provided with the recessed parts 40. The recessed part forming part 28b is disposed on the columnar part forming part 28a.

The columnar part 30 has the first semiconductor layer 24, the active layer 26, and the columnar part forming part 28a of the second semiconductor layer 28. Although the three columnar parts 30 are disposed in the illustrated example, the number thereof is not particularly limited. A planar pattern of the columnar part 30 is, for example, a stripe shape, a dot shape, or a lattice shape, and in the case of dot shape, the planar shape of the dot is a polygonal shape such as a hexagonal shape, a circle, or the like.

The size (e.g., a diameter of a minimum circle (a minimum enclosing circle) including a polygon inside, when the planar shape of the columnar part 30 is the polygon, or a diameter when the planar shape of the columnar part 30 is a circle) of the columnar part 30 in the case of the dot shape is larger than the opening size D of the recessed part 40. An interval between the columnar parts 30 adjacent to each other is larger than an interval between the recessed parts 40 adjacent to each other. The plurality of recessed parts 40 is arranged at a first pitch P1 in a predetermined direction (e.g., a direction from the first side surface 26a toward the second side surface 26b of the active layer 26). The plurality of columnar parts 30 is arranged at a second pitch P2 in the predetermined direction (the direction in which the plurality of recessed parts 30 is arranged). The first pitch P1 is smaller than the second pitch P2.

The size of the columnar part 30 is, for example, no smaller than 10 nm and no larger than 1 μm. The size in the stacking direction of the columnar part 30 is, for example, no smaller than 0.1 μm and no larger than 5 μm. An interval between the columnar parts 30 adjacent to each other is, for example, no smaller than 1 nm and no larger than 500 nm.

In the light emitting device 200, the light generated in the active layer 26 is multiply reflected between, for example, the side surface 26a at one side of the columnar part 30a located at the extreme one side out of the plurality of columnar parts 30 and the side surface 26b at the other side of the columnar part 30b located at the extreme the-other side out of the plurality of columnar parts 30, and forms a standing wave. In the light emitting device 200, it is possible to confine the light in the area where the plurality of columnar parts 30 is disposed in the plan view by the plurality of columnar parts 30. Then, the light generated in the active layer 26 causes the laser oscillation, and the light emitting device 200 emits the laser beam from the first side surface 26a or the second side surface 26b. It should be noted that in the light emitting device 200, since the plurality of columnar parts 30 are provided, it is possible to emit positive first-order diffracted light and negative first-order diffracted light as the laser beam in the stacking direction.

Figure 12:
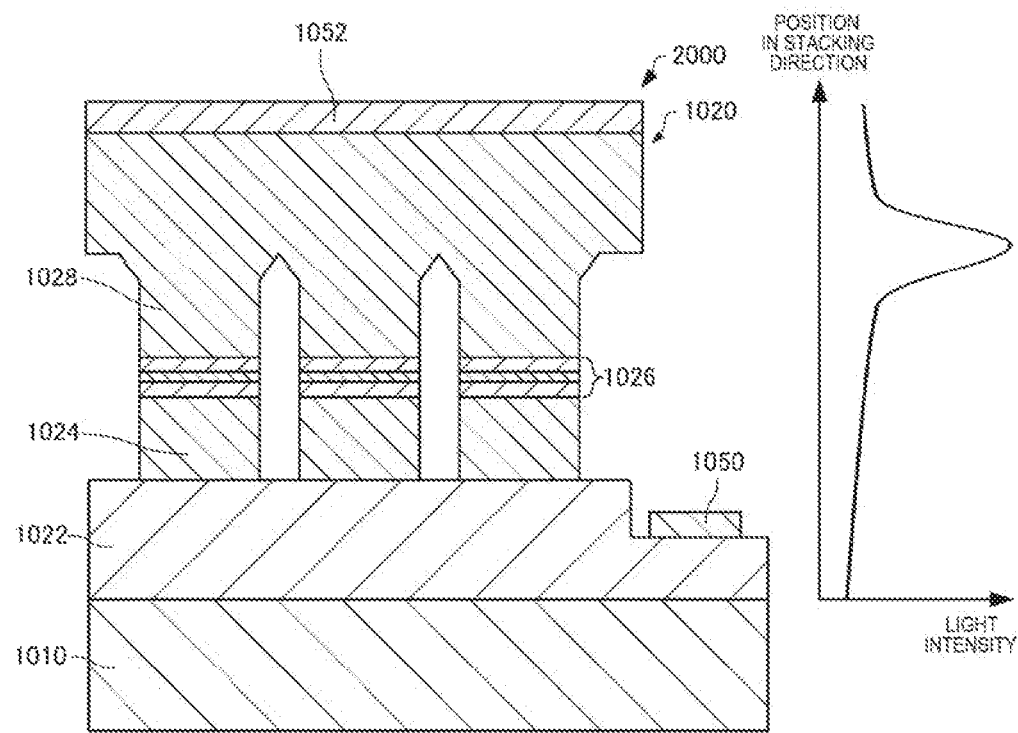
FIG. 12 is a cross-sectional view schematically showing a light emitting device according to a reference example.

Since the light emitting device 200 is provided with the recessed parts 40, it is possible to reduce the absorption of the light by the second electrode 52 similarly to the light emitting device 100 described above. As shown in FIG. 12, in a light emitting device 2000 (the light emitting device 2000 according to a reference example) in which the laminated structure 1020 is not provided with recessed parts, the light generated in the active layer 1026 is leaked toward the second electrode 1052 side, and is absorbed in the second electrode 1052 to cause a loss in some cases.

Since there is, for example, a void between the columnar part 30 and the columnar part 30, by disposing the columnar parts 30, an average refractive index in the planar direction of a part where the columnar parts 30 are disposed lowers. However, in the light emitting device 200, by disposing the recessed parts 40, it is possible to inhibit the light generated in the active layer 26 from being leaked toward the second electrode 52 side even when the columnar parts 30 are disposed.

In the light emitting device 200, the first pitch P1 is smaller than the second pitch P2. Therefore, in the light emitting device 200, it is possible to prevent the effect of confining the light generated in the active layer 26 from being affected by the plurality of recessed parts 40.

In the light emitting device 200, the second electrode 52 is disposed on the low refractive-index parts 42. Therefore, in the light emitting device 200, it is possible to reduce the resistance in the planar direction of the second electrode 52 compared to when the second electrode 52 is not disposed on the low refractive-index parts 42.

It should be noted that although not shown in the drawing, the light emitting device 200 is not required to have the columnar parts 30 as in the light emitting device 100 shown in FIG. 1.

Further, in the light emitting device 200, the bottom surface 40b of the recessed part 40 can also be the surface of the active layer 26 as in the light emitting device 110 shown in FIG. 7.

Further, in the light emitting device 200, it is possible for the laminated structure 20 to have the etch stopper layer 29 between the active layer 26 and the second semiconductor layers 28 as in the light emitting device 120 shown in FIG. 8.

Further, in the light emitting device 200, the low refractive-index parts 42 are not required to be the void, as in the light emitting device 140 shown in FIG. 10.

2.2. Method of Manufacturing Light Emitting Device

Figure 13:
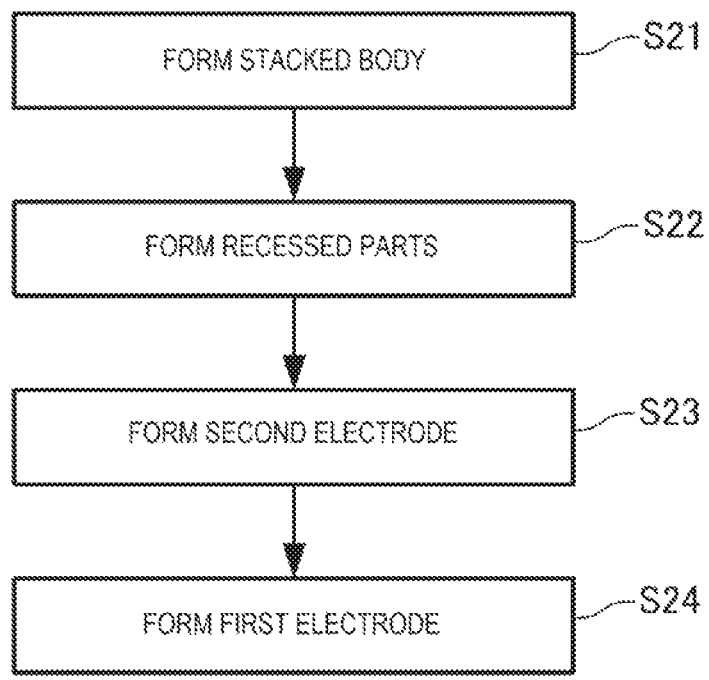
FIG. 13 is a flowchart for explaining a method of manufacturing the light emitting device according to the second embodiment.
Figure 17:
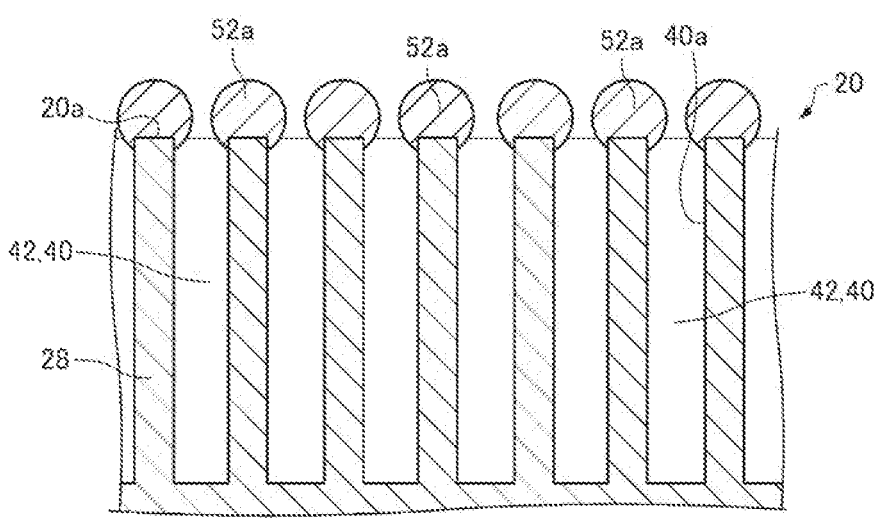
FIG. 17 is a cross-sectional view schematically showing a manufacturing process of the light emitting device according to the second embodiment.
Figure 18:
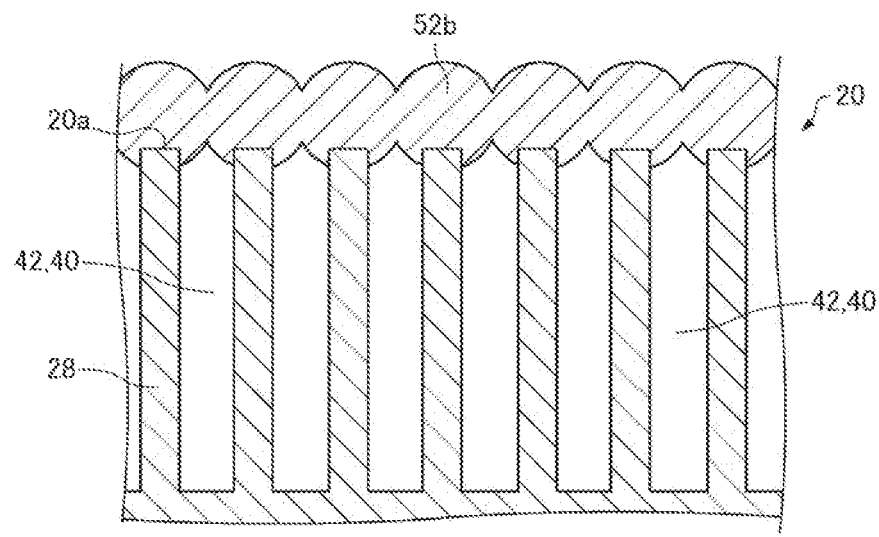
FIG. 18 is a cross-sectional view schematically showing a manufacturing process of the light emitting device according to the second embodiment.

Then, a method of manufacturing the light emitting device 200 according to the second embodiment will be described with reference to the drawings. FIG. 13 is a flowchart for explaining the method of manufacturing the light emitting device 200 according to the second embodiment. FIG. 14 through FIG. 18 are cross-sectional views schematically showing a manufacturing process of the light emitting device 200 according to the second embodiment. It should be noted that FIG. 17 and FIG. 18 are enlarged views in the vicinity of the recessed parts 40.

Hereinafter, in the method of manufacturing the light emitting device 200 according to the second embodiment, the points in which the light emitting device 200 is different from the example of the light emitting device 100 according to the first embodiment described above will be described, and the description of the points in which the light emitting devices are substantially the same will be omitted or simplified.

The buffer layer 22, the first semiconductor layer 24, the active layer 26, and the second semiconductor layer 28 are formed on the substrate 10 in this order to form (step S21) the laminated structure 20.

Figure 14:
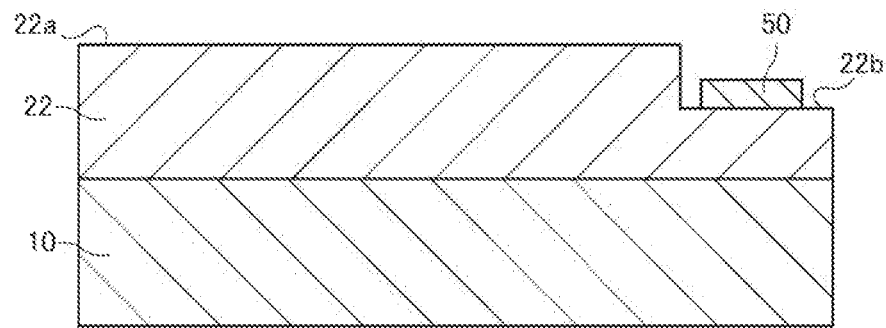
FIG. 14 is a cross-sectional view schematically showing a manufacturing process of the light emitting device according to the second embodiment.

Specifically, firstly, as shown in FIG. 14, the buffer layer 22 is grown epitaxially on the substrate 10. Then, a Ti layer (not shown), for example, is formed on the buffer layer 22 using a sputtering method or the like. Then, a resist layer (not shown) is applied on the Ti layer, then patterning is performed on the resist layer using the electron-beam lithography or the like, and then the Ti layer is etched using an ICP (Inductively Coupled Plasma) device with, for example, C12 gas as the etching gas.

Figure 15:
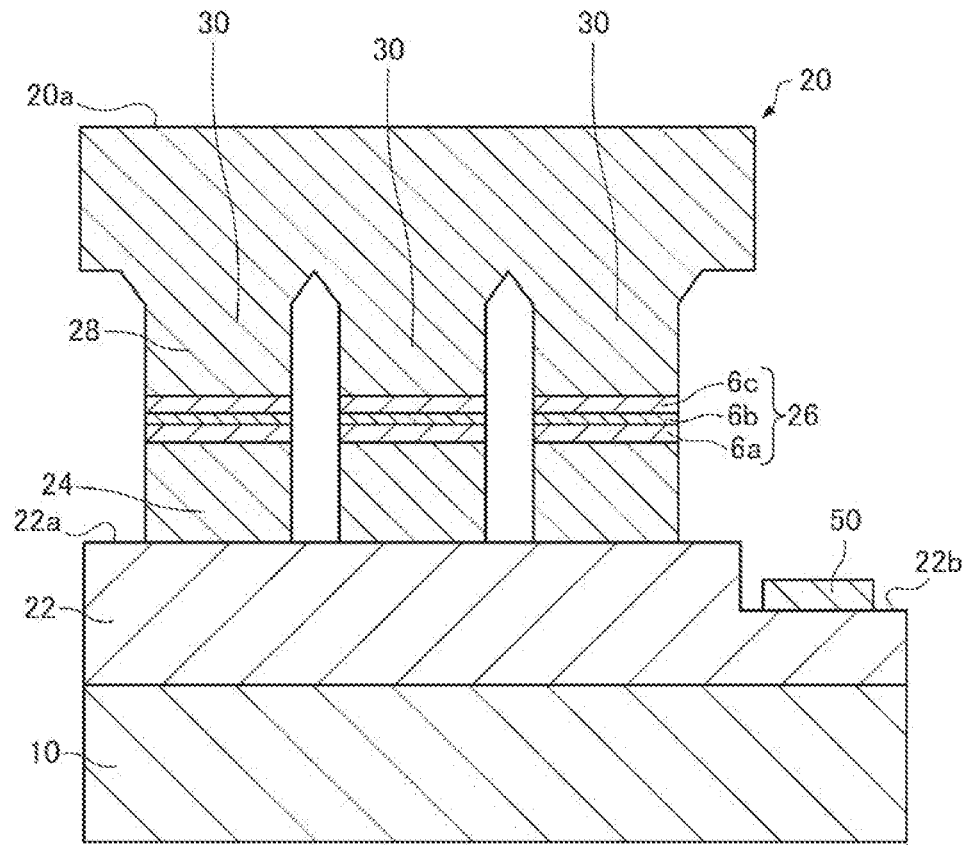
FIG. 15 is a cross-sectional view schematically showing a manufacturing process of the light emitting device according to the second embodiment.

Subsequently, as shown in FIG. 15, the first semiconductor layer 24, the active layer 26, and the second semiconductor layer 28 are grown epitaxially in this order on the buffer layer 22 using the Ti layer thus etched as a mask to form the columnar parts 30. For example, by controlling the growth temperature of the second semiconductor layer 28, it is possible to form a shape in which the columnar parts 30 are continuous with each other in the upper part of the second semiconductor layer 28. According to the above, it is possible to form the laminated structure 20.

Figure 16:
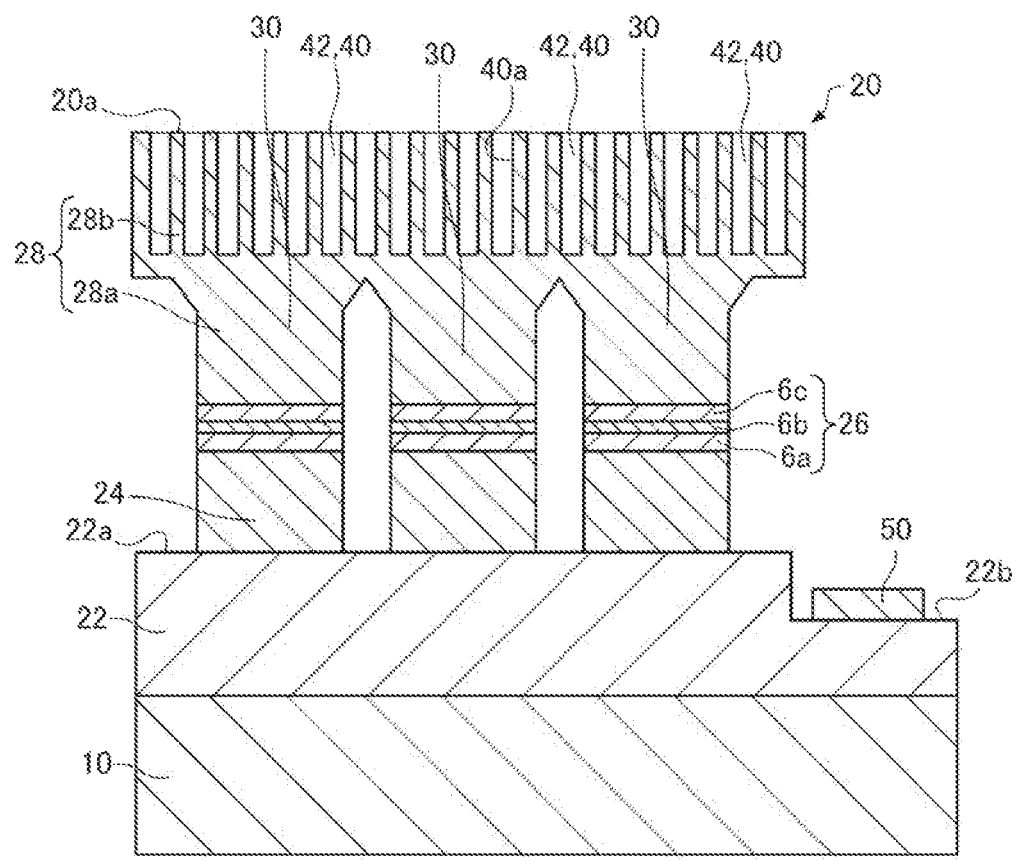
FIG. 16 is a cross-sectional view schematically showing a manufacturing process of the light emitting device according to the second embodiment.

Then, as shown in FIG. 16, the recessed parts 40 provided with the low refractive-index parts 42 are formed (step S22) in the upper surface 20a of the laminated structure 20.

Specifically, an $SiO_2$ layer (not shown), for example, is formed on the laminated structure 20 using a sputtering method or the like. Then, a resist layer (not shown) is applied on the $SiO_2$ layer, then patterning is performed on the resist layer using the electron-beam lithography or the like, and then the $SiO_2$ layer is etched with a fluorinated gas such as $CF_4$. Then, the recessed parts 40 are formed in the second semiconductor layer 28 using the fluorinated gas. According to the above, it is possible to form the recessed parts 40 provided with the low refractive-index parts 42.

Then, the second electrode 52 is formed (step S23) on the laminated structure 20 and on the low refractive-index parts 42.

Specifically, as shown in FIG. 17, metal 52a to be the second electrode 52 is evaporated on the upper surface 20a of the laminated structure 20 using a vacuum evaporation method. Since the deposition with the vacuum evaporation is high in straightness, the metal 52a hardly comes around to the inner side surface 40a of the recessed part 40. Further, when the metal 52a adheres to the upper surface 20a, the metal 52a having adhered thereto functions as a mask, and the cross-sectional surface of the metal 52a forms a spherical shape, and the deposition of the metal 52a progresses. Then, when the evaporation continues, the metal 52a is connected to form film-like metal 52b as shown in FIG. 18. Once the metal 52a is connected to form the film-like metal 52b, thereafter, the metal does not enter the recessed part 40. According to the process described hereinabove, it is possible to form the second electrode 52 as shown in FIG. 11. It should be noted that in patterning of the second electrode 52, it is possible to use a liftoff process, or to use photolithography and etching.

Then, the first electrode 50 is formed (step S24) on the second upper surface 22b of the buffer layer 22.

According to the process described hereinabove, it is possible to manufacture the light emitting device 200.

3. Third Embodiment

Figure 19:
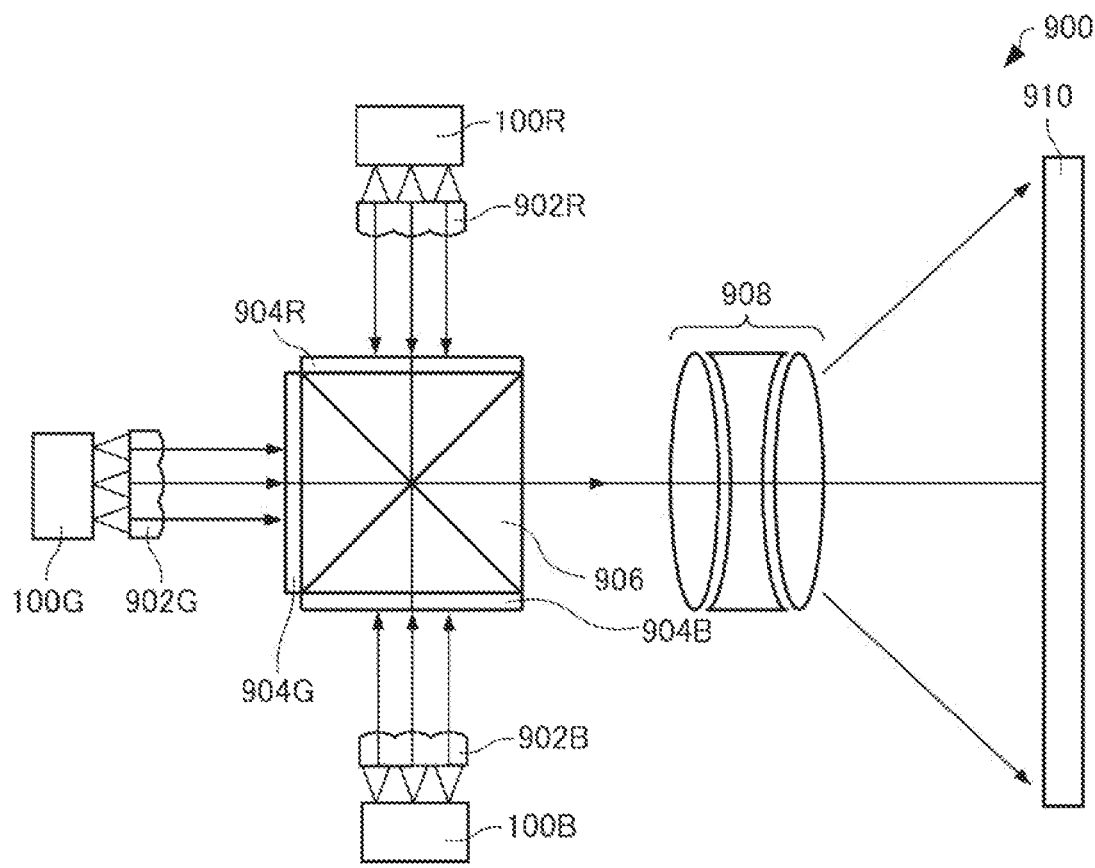
FIG. 19 is a diagram schematically showing a projector according to a third embodiment.

Then, a projector according to a third embodiment will be described with reference to the drawings. FIG. 19 is a diagram schematically showing the projector 900 according to the third embodiment.

The projector according to the present disclosure includes the light emitting device according to the present disclosure. Hereinafter, the projector 900 including the light emitting device 100 as the light emitting device according to the present disclosure will be described.

The projector 900 includes a housing (not shown), a red light source 100R, a green light source 100G, and a blue light source 100B disposed inside the housing and for respectively emitting red light, green light, and blue light. Each of the red light source 100R, the green light source 100G and the blue light source 100B has, for example, a plurality of light emitting devices 100 arranged in an array in a direction perpendicular to the stacking direction, wherein a common substrate is used in common in the plurality of light emitting devices 100 as the respective substrates 10. The number of the light emitting devices 100 constituting each of the light sources 100R, 100G, and 100B is not particularly limited. It should be noted that in FIG. 19, the housing constituting the projector 900 is omitted, and further, the light sources 100R, 100G, and 100B are simplified for the sake of convenience.

The projector 900 further includes lens arrays 902R, 902G, and 902B, transmissive liquid crystal light valves (light modulation devices) 904R, 904G, and 904B, and a projection lens (a projection device) 908 disposed in the housing.

The light emitted from the light sources 100R, 100G, and 100B enter the respective lens arrays 902R, 902G, and 902B. The light emitted from the light sources 100R, 100G, and 100B can be collected by the lens arrays 902R, 902G, and 902B, and can be, for example, superimposed (partially superimposed). Thus, it is possible to irradiate the liquid crystal light valves 904R, 904G, and 904B with uniformity.

The light collected by the respective lens arrays 902R, 902G, and 902B enters the respective liquid crystal light valves 904R, 904G, and 904B. The liquid crystal light valves 904R, 904G, and 904B respectively modulate the incident light in accordance with image information. Then, the projection lens 908 projects the images (pictures) formed by the liquid crystal light valves 904R, 904G, and 904B on a screen (a display surface) 910 in an enlarged manner.

Further, the projector 900 can include a cross dichroic prism (colored light combining means) 906 which combines the light emitted from the liquid crystal light valves 904R, 904G, and 904B with each other, and then guides the light combined to the projection lens 908.

The three colored light beams modulated by the respective liquid crystal light valves 904R, 904G, and 904B enter the cross dichroic prism 906. This prism is formed by bonding four rectangular prisms to each other, and is provided with a dielectric multilayer film for reflecting the red light and a dielectric multilayer film for reflecting the blue light disposed on the inside surfaces so as to form a crisscross. The three colored light beams are combined with each other by these dielectric multilayer films, and the light representing a color image is formed. Then, the light thus combined is projected on the screen 910 by the projection lens 908 as the projection optical system, and thus an enlarged image is displayed.

It should be noted that it is also possible for the light sources 100R, 100G, and 100B to directly form the picture without using the liquid crystal light valves 904R, 904G, and 904B by controlling (modulating) the light emitting devices 100 constituting the light sources 100R, 100G, and 100B as pixels of the picture in accordance with the image information. Then, it is also possible for the projection lens 908 to project the picture formed by the light sources 100R, 100G, and 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and the digital micromirror device. Further, the configuration of the projection optical system is appropriately modified in accordance with the type of the light valves used therein.

Further, by scanning the screen with the light from the light sources 100R, 100G, and 100B, it is possible to apply the light sources 100R, 100G, and 100B also to the light source device of a scanning type image display device (a projector) having scanning means as an image forming device for displaying an image with a desired size on the display surface.

The purpose of the light emitting device according to the present disclosure is not limited to the embodiments described above, but the light emitting device can also be used as an indoor/outdoor illumination, a backlight for a display, and a light source of a laser printer, a scanner, an in-car light, sensing equipment using light, communication equipment, and so on besides the projector.

4. Experimental Example

Hereinafter, an experimental example will be shown to more specifically describe the present disclosure. It should be noted that the disclosure is not at all limited by the following experimental example.

4.1. Models

4.1.1. First Model

A simulation was performed using a model in the first area 2 of such a light emitting device as shown in FIG. 1 as a first model. As the first semiconductor layer 24, there was used an $Al_{0.2}Ga_{0.8}N$ layer (infinite thickness). As the first guide layer 6a, there was adopted the SL structure having 20 pairs of $In_{0.2}Ga_{0.8}N$ layer (thickness of 1.5 nm) and GaN layer (thickness of 1.5 nm) stacked on one another. As the quantum-well layer 6b, there was adopted the MQW structure having 5 pairs of $In_{0.2}Ga_{0.8}N$ layer (thickness of 3 nm) and GaN layer (thickness of 12 nm) stacked on one another. As the second guide layer 6c, there was adopted the SL structure having 20 pairs of $In_{0.2}Ga_{0.8}N$ layer (thickness of 1.5 nm) and GaN layer (thickness of 1.5 nm) stacked on one another. As the second semiconductor layer 28, there was used the GaN layer, and the depth of the recessed part 40 was made infinite. The distance between the bottom surface 40b of the recessed part 40 and the active layer 26 was set to 100 nm. It was arranged that the ratio $(S_A/(S_A+S_B))$ between the cross-sectional area $S_A$ of the recessed part 40 and the cross-sectional area $S_B$ of the second semiconductor layer 28 becomes 25% when being cut by a plane parallel to the planar direction passing through the recessed part 40.

4.1.2. Second Model

A second model is the same as the first model except that the recessed parts 40 were not disposed. In other words, in the second model, the ratio $(S_A/(S_A+S_B))$ is 0%.

4.2. Calculation Result

Figure 20:
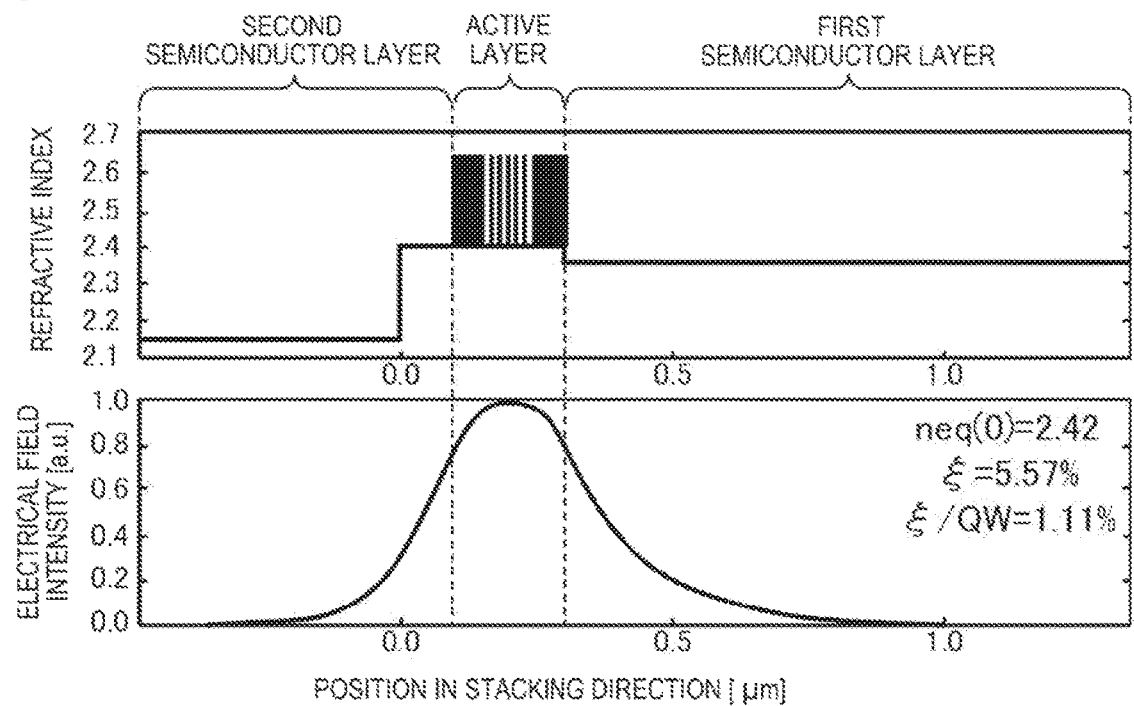
FIG. 20 shows a result of a simulation of a first model.
Figure 21:
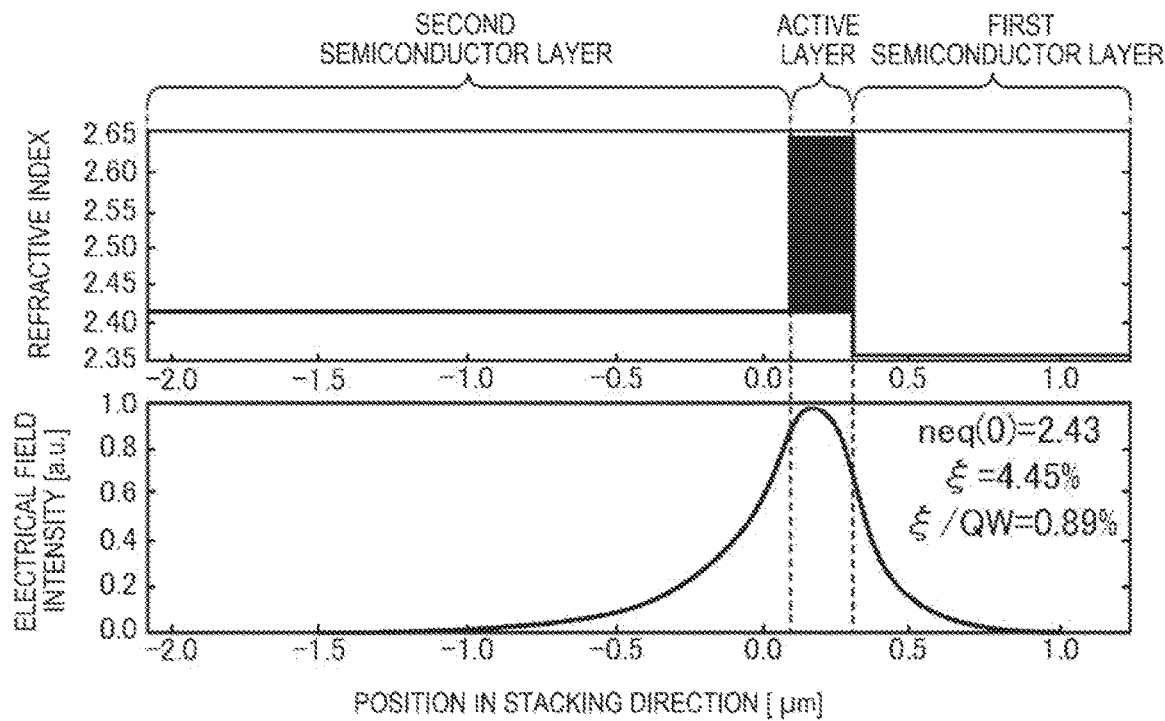
FIG. 21 shows a result of a simulation of a second model.

In the first model and the second model described above, calculation was performed with respect to the light confinement in the stacking direction using a one-dimensional transfer matrix method. FIG. 20 shows a result of the simulation of the first model. FIG. 21 shows a result of the simulation of the second model. In FIG. 20 and FIG. 21, the horizontal axis represents the position in the stacking direction, and the vertical axis represents the average refractive index and the electrical field intensity in the planar direction at the position in the stacking direction. It should be noted that the active layer is constituted by a number of pairs of the two types of layers different in refractive index stacked on one another, and is shown as if being filled black in the graphs of the refractive index shown in FIG. 20 and FIG. 21.

As shown in FIG. 20 and FIG. 21, it was found out that the confinement factor $\xi$ to the quantum-well layer was improved to 5.57% in the first model from 4.45% in the second model. Further, the leakage of the light toward the second semiconductor layer side could be suppressed in a range of 200 nm through 300 nm in the first model while the light was leaked as much as about 1 μm toward the second semiconductor layer side in the second model. Therefore, it was confirmed that by disposing the recessed parts, the leakage of the light toward the second semiconductor layer side could be suppressed.

It should be noted that in FIG. 20 and FIG. 21, there are also shown an effective refractive index neq(0) and the confinement factor $\xi$/QW per unit pair of $In_{0.2}Ga_{0.8}N$ layer and GaN layer in the quantum-well layer.

Although it is also possible to suppress the loss of the light in the second electrode by, for example, increasing the thickness of the second semiconductor layer, the increase in film thickness of the second semiconductor layer leads directly to an increase in resistance. Even when the resistivity of the second semiconductor layer increases 1.3 times by setting the ratio $(S_A/(S_A+S_B))$ to 25%, it is possible to inhibit an increase in resistance of the second semiconductor layer when the thickness of the second semiconductor layer can be reduced to about ¼ compared to when the recessed parts are not formed.

In the present disclosure, some of the constituents can be omitted, or the embodiments and the modified examples can be combined with each other within a range in which the features and the advantages described in the specification are provided.

The present disclosure includes configurations (e.g., configurations having the same function, the same way, and the same result, or configurations having the same object and the same advantage) substantially the same as the configuration described as the embodiments. Further, the present disclosure includes configurations obtained by replacing a non-essential part of the configuration described as the embodiments. Further, the present disclosure includes configurations providing the same functions and advantages and configurations capable of achieving the same object as those of the configuration described as the embodiments.

Further, the present disclosure includes configurations obtained by adding known technologies to the configuration described as the embodiments.

The invention claimed is:

1. A light emitting device comprising:
a substrate;
a laminated structure provided to the substrate;
a plurality of recessed parts disposed at an opposite side of the laminated structure with respect to the substrate; and
an electrode disposed at the opposite side of the laminated structure,
wherein the laminated structure includes a plurality of columnar parts, each of the plurality of columnar parts includes:
   a first semiconductor layer,
   a second semiconductor layer different in conductivity type from the first semiconductor layer; and
   an active layer disposed between the first semiconductor layer and the second semiconductor layer,
the first semiconductor layer is disposed between the substrate and the active layer,
each of the plurality recessed parts is provided with a low refractive-index part lower in refractive index than the second semiconductor layer,
a depth of each of the plurality of recessed parts is no larger than a distance between a surface at the opposite side of the laminated structure and the active layer,
the plurality of the recessed parts is arranged in a predetermined direction at a first pitch,
the plurality of columnar parts is arranged in the predetermined direction at a second pitch, and
the first pitch is smaller than the second pitch.

2. The light emitting device according to claim 1, wherein the electrode is disposed at an opposite side of the low refractive-index part with respect to the substrate.

3. The light emitting device according to claim 1, wherein the low refractive-index part is a void.

4. A projector comprising:
the light emitting device according to claim 1.

* * * * *